(12) United States Patent  
Westwick et al.

(10) Patent No.: US 7,821,441 B2  
(45) Date of Patent: Oct. 26, 2010

(54) SAR ANALOG-TO-DIGITAL CONVERTER HAVING VARIABLE CURRENTS FOR LOW POWER MODE OF OPERATION

(75) Inventors: Alan Westwick, Austin, TX (US); Xiaoling Guo, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 9 days.

(21) Appl. No.: 12/339,757

(22) Filed: Dec. 19, 2008

(65) Prior Publication Data

US 2010/0156685 A1  Jun. 24, 2010

(51) Int. Cl.  
*H03M 1/34* (2006.01)

(52) U.S. Cl. .................. 341/163; 341/155; 341/172

(58) Field of Classification Search .............. 341/155, 341/150, 163, 156, 172  
See application file for complete search history.

(56) References Cited

U.S. PATENT DOCUMENTS

| | | | | |
|---|---|---|---|---|
| 5,675,340 A | * | 10/1997 | Hester et al. | 341/156 |
| 6,124,818 A | * | 9/2000 | Thomas et al. | 341/155 |
| 6,864,821 B2 | * | 3/2005 | Yang | 341/155 |
| 6,897,801 B2 | * | 5/2005 | Confalonieri et al. | 341/172 |
| 6,906,657 B1 | * | 6/2005 | A | 341/163 |
| 6,940,445 B2 | * | 9/2005 | Kearney | 341/163 |
| 7,188,199 B2 | * | 3/2007 | Leung et al. | 710/69 |
| 2003/0123646 A1 | * | 7/2003 | Srinivasan et al. | 379/399.01 |
| 2004/0227654 A1 | * | 11/2004 | Yang | 341/172 |
| 2005/0083221 A1 | * | 4/2005 | Seymour | 341/150 |
| 2006/0001563 A1 | * | 1/2006 | Kearney | 341/155 |
| 2007/0236380 A1 | * | 10/2007 | La Rue et al. | 341/155 |

* cited by examiner

*Primary Examiner*—Jean B Jeanglaude  
(74) *Attorney, Agent, or Firm*—Howison & Arnott, L.L.P.

(57) ABSTRACT

A successive approximation analog-to-digital converter includes a capacitor array having a plurality of switch capacitors therein with varying weights, each having a common plate connected to a common node and a switched plate. A SAR controller samples an input voltage on said capacitor array in a sampling phase and redistributes the charge stored therein in a conversion phase by selectively increasing the voltage on select capacitors of the capacitor array in accordance with a SAR conversion algorithm. Circuitry controls the sampling of the input voltage by the capacitor array and is responsive to at least one applied bias current. The at least one applied bias current operates at a first level responsive to a first mode of operation of the SAR ADC and operates at a second level responsive to a second mode of operation of the SAR ADC.

18 Claims, 6 Drawing Sheets

US 7,821,441 B2

SAR ANALOG-TO-DIGITAL CONVERTER HAVING VARIABLE CURRENTS FOR LOW POWER MODE OF OPERATION

CROSS-REFERENCE TO RELATED APPLICATIONS

N/A

TECHNICAL FIELD

The present invention relates to successive approximation register Analog-to-Digital (A/D) converters, and more particularly, to successive approximation A/D converters utilizing variable bias currents within the components of the converter in a low power mode of operation.

BACKGROUND

A successive approximation analog-to-digital converter (ADC) has been the mainstay of data acquisition systems for many years. Recent design improvements have extended the sampling frequency of these ADCs into the megahertz region with 18-bit resolution. The basic successive approximation ADC performs conversions on command. In order to process AC signals, SAR ADCs must have an input sample-and-hold device to keep the signal constant during the conversion cycle. On the assertion of a CONVERT START command, the sample-and-hold device is placed in the hold mode, and an internal digital-to-analog converter (DAC) is set to mid-scale. A comparator determines whether the sampled analog value is above or below the DAC output, and the result (bit 1, the most significant bit of the conversion) is stored in the successive approximation register (SAR). The DAC is set either to ¼ scale or ¾ scale (depending on the value of bit 1), and the comparator makes the decision for bit 2 of the conversion. The result is stored in the register, and the process continues until all of the bit values have been determined. When all the bits have been set, tested, and reset or not as appropriate, the contents of the SAR correspond to the value of the analog input, and the conversion is complete. These bit "tests" form the basis of a serial output version SAR ADC. Note that the acronym "SAR" actually stands for Successive Approximation Register (the logic block that controls the conversion process), but is universally accepted as the acronym for the architecture itself.

The DAC portion of the SAR ADC can utilize a capacitor network. The advantage of the switched-capacitor DAC is that the accuracy and linearity is primarily determined by high-accuracy photolithography, which in turn controls the capacitor plate area, and the capacitance as well as matching. In addition, small capacitors can be placed in parallel with the main capacitors, which can be switched in and out with bit switches under control of autocorrelation routines to achieve high accuracy and linearity without the need for thin-film laser trimming.

Each of the capacitors in the switched capacitor DAC has one plate thereof connected to a common node, which is connected to one input of a comparator, and the other plate thereof connected to an associated switch that can connect the plate to ground, the analog input voltage, AIN, or a reference voltage, VREF. In the sample or tracking mode, the analog input voltage, AIN, is constantly charging and discharging the parallel combination of all the capacitors. The hold mode is initiated by opening the switch, thus leaving the sampled analog input voltage on the capacitor array. Typically, the other input of the comparator is connected to ground or a common mode voltage. Some type of auto-zero switch will maintain the inputs at the same voltage until after AIN has been sampled, at which time the common node is allowed to "float" allowing the voltage at the common node to move as the bit switches are manipulated. If respective bit switches are all connected to ground, a voltage equal to −AIN appears at the common node. Connecting the bit switch for the most significant bit (MSB) to VREF adds a voltage equal to VREF/2 to −AIN. The comparator makes the MSB bit decision, i.e., is the common node above the voltage on the reference input to the comparator, and the SAR either leaves MSB bit switch connected to VREF or connects it to ground depending on the comparator output (which is high or low depending on whether the voltage at the common node is negative or positive, respectively).

The various components of the SAR ADC require bias currents to operate. The bias current needs can be different based on the power requirements of the SAR ADC. There is a need to provide the ability to alter these bias currents based upon the power requirements of the SAR ADC.

SUMMARY

The present invention, as disclosed and described herein, in one aspect thereof, comprises a successive approximation register (SAR) analog-to-digital converter (ADC). The SAR ADC includes a capacitor array including a plurality of switch capacitors therein with varying weights each having a common plate connected to a common node and a switched plate. A SAR controller samples an input voltage on said capacitor array in a sampling phase and redistributes the charge stored thereon in a conversion phase by selectively changing the voltage on select capacitors of the capacitor array in accordance with a SAR conversion algorithm. The SAR ADC further includes circuitry for controlling the sampling of the input voltage by the capacitor array that is responsive to at least one applied bias current. The at least one applied bias current operates at a first level responsive to a first mode of operation of the SAR ADC and operates at a second level responsive to a second mode of operation of the SAR ADC.

BRIEF DESCRIPTION OF THE DRAWINGS

For a more complete understanding, reference is now made to the following description taken in conjunction with the accompanying Drawings in which.

DETAILED DESCRIPTION

Figure 1:
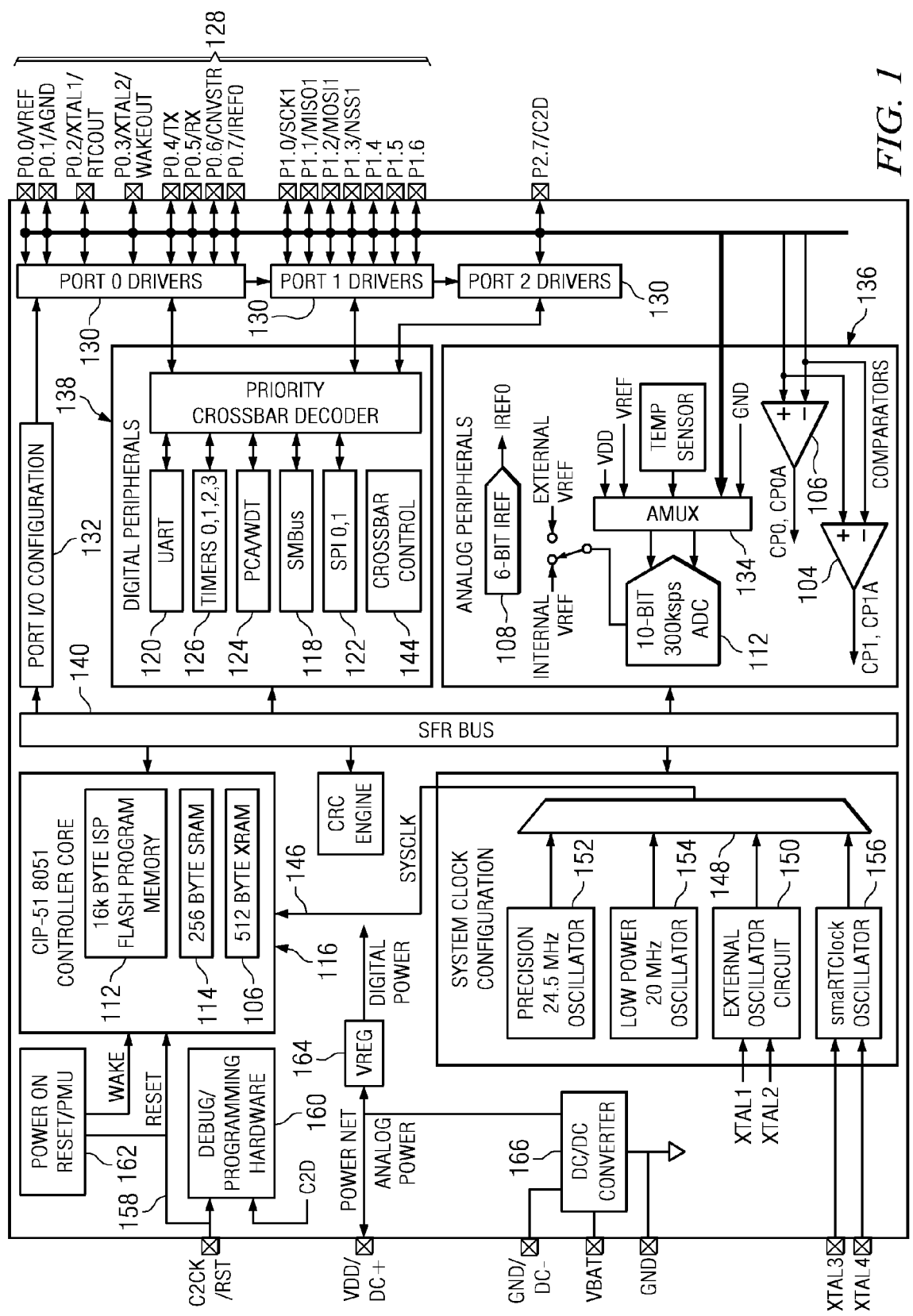
FIG. 1 illustrates an integrated circuit including a successive approximation (SAR) analog-to-digital converter (ADC)

Referring now to the drawings, wherein like reference numbers are used herein to designate like elements throughout, the various views and embodiments of a SAR analog-to-digital converter having variable currents for low power mode of operation are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to FIG. 1, there is illustrated an integrated circuit that is comprised of a fully integrated mixed signal system on a chip with a 10 bit multichannel ADC 102, 2 voltage comparators 104 and 106, a 6 bit current reference 108 and an 8051 compatible microcontroller core 110 with 16 kB of flash memory 112. The microcontroller core 110 also includes 256 bytes of SRAM memory 114 and 512 bytes of XRAM memory 116. There is also provided an I²C/SMBus 118, a UART 120 and a SPI 122 serial interface implemented in hardware (not "bitbanged" in user software) as well as programmable counter array/watch dog timer 124 and various system timers 126. There are also provided 16 general purpose port I/Os 128 that are driven by a number of port drivers 130. The port drivers 130 are configured via a port I/O configuration logic 132.

The analog peripherals include a multiplexer 134, which is operable to interface analog inputs to the analog-to-digital converter 102. The microcontroller core 110 effectively configures and manages the analog peripherals 136 and the digital peripherals 138. The flash memory 112 can be reprogrammed even in circuit providing non-volatile data storage, and also allowing field upgrades of the 8051 firmware. The MCU 100 can also individually shut down any or all of the various peripherals to conserve power. The processing core 110 is interfaced through an internal SFR bus 140 to the various input/output blocks. A priority crossbar decoder 142 under the control of crossbar control logic 144 provides an interface between the UART 130, timers 126, PCA/watch dog timer 124, SMBus 118 and SPI interface 122 with the digital I/O output pins 128. This is a configurable interface. The priority crossbar decoder 142 can be configured to interface with any of the ports of the I/O side thereof, which provide interface between the crossbar 142 and the core 110. Further, the crossbar decoder 142 can interface through any of the functional blocks 118 through the SFR bus 140. The crossbar control block 144 is configured by the processing core 110. In addition, the processing core 110 is operable to configure the analog peripherals 136.

The processing core 110 is controlled by a clock signal provided via system clock line 146. The clock is selected from one of four sources with a multiplexer 148. The first source is an external oscillator circuit 150. The multiplexer 148 may also select one of an internal 24.5 MHz precision oscillator 152 or a low power 20 MHz internal oscillator 154. The multiplexer 148 may also provide a clock signal from a real time clock oscillator 156. The processing core 110 is also controlled by a reset input on reset line 158.

The debugging/programming hardware 160 allows non-intrusive, full speed in circuit debugging using the MCU processing core 110. This debug hardware 160 supports inspection, modification of memory and registers, setting brake points, single stepping, run and halt commands. All analog and digital peripherals are fully functional while debugging using C2. The C2 interface pins can be shared with user functions allowing in system debugging without occupying package pins. The CRC engine enables CRC checks of data.

The power on reset/PMU module 162 allows the generation of reset and wake up signals to the processing core 110. The voltage regulator 164 provides a regulated voltage to the digital peripheral components 138 responsive to the system power $V_{DD}$ provided via the power net or from the DC/DC boost converter 166.

Figure 2:
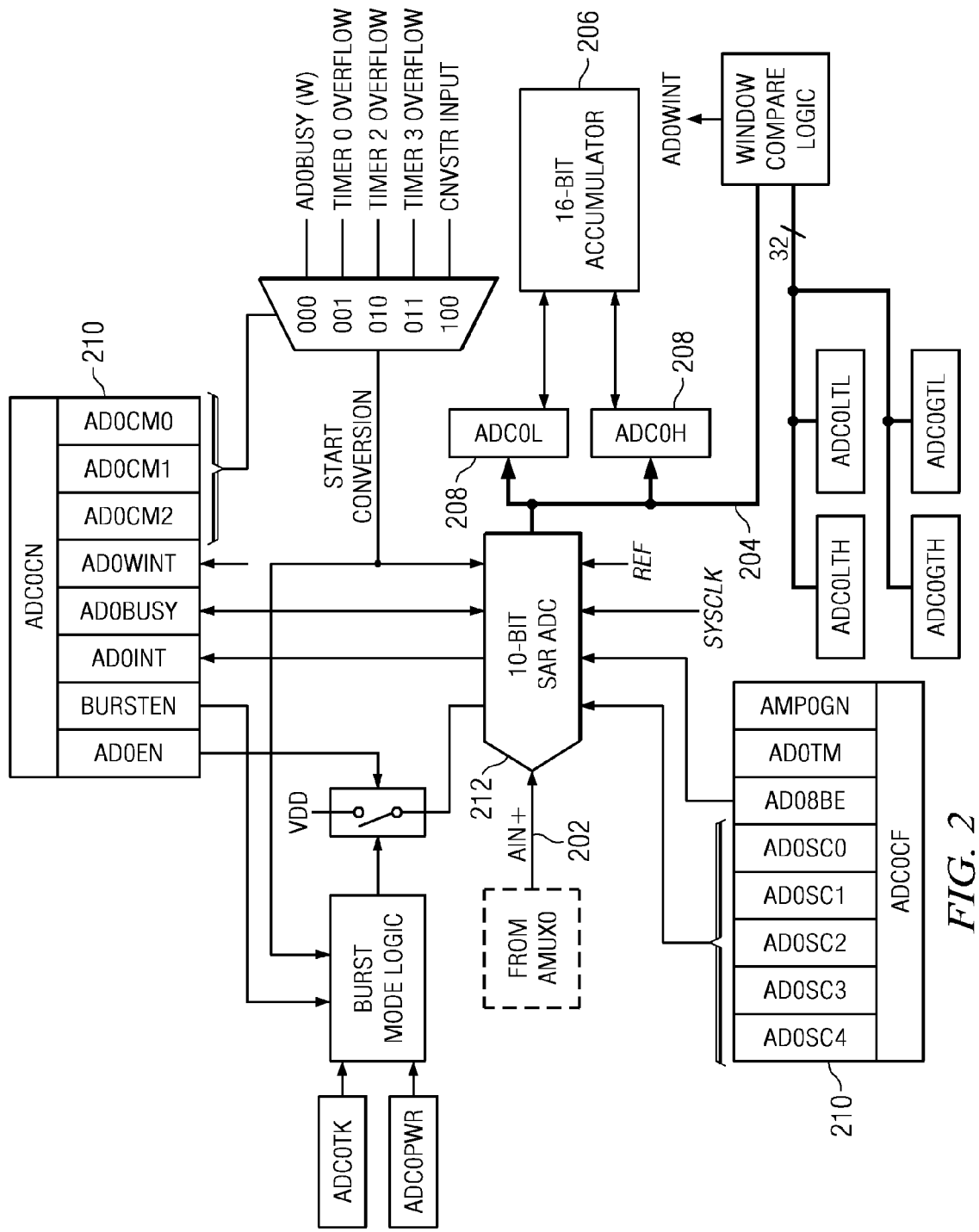
FIG. 2 illustrates a block diagram of an N-bit SAR analog-to-digital converter.

The DC/DC boost converter 166 allows operation from a single cell battery with a supply voltage as low as 0.9 volts. The DC/DC boost converter 166 is a switching boost converter with an input voltage range of 0.9 to 1.8 volts and has a programmable output voltage range of 1.8 to 3.3 volts. The default output voltage is 1.9 volts. The input voltage must be at least 0.2 volts lower than the output voltage. The DC/DC boost converter 166 can supply the chip with up to 65 mW of regulated power and can be used for powering other devices in the system. This allows the most flexibility when interfacing to sensors and other analog signals which typically require higher supply voltages than a single cell battery can provide Referring now to FIG. 2, there is illustrated a block diagram of the N-bit SAR analog-to-digital converter 102. The SAR analog-to-digital converter 102 receives analog signals over a line 202 from the analog MUX 134 (FIG. 1). The output of the SAR ADC 212 is provided via bus 204 to a 16-bit accumulator 206 through associated registers 208. The successive approximation register (SAR) ADC 102, in a preferred embodiment, is a 10-bit device with integrated track and hold and a programmable window detector. The 16-bit accumulator 206 can automatically average the ADC results in order to enable effective 11, 12 or 13-bit ADC results without additional CPU intervention. The analog-to-digital converter 102 can sample the voltage on any of the GPIO pins through input line 202 from the analog MUX 134. The analog-to-digital converter 102 is preferably configurable under software control via a number of special function registers 210. The registers ADCOH 208a and ADCOL 208b contain the high and low bytes of the output conversion code from the ADC at the completion of each conversion. The accumulator 206 accumulates consecutive samples of sets of 4, 8, 16, 32, or 64 samples. The control bits of the ADOSJST SFR Register can be used to format the contents of the 16-bit accumulator 206. The accumulator 206 results can be shifted right by one, two, or three bit positions. Using over-sampling and averaging, the effective resolution of the analog-to-digital converter 102 can be increased by one bit each time the over-sampling rate is increased by a factor of four.

Figure 3:
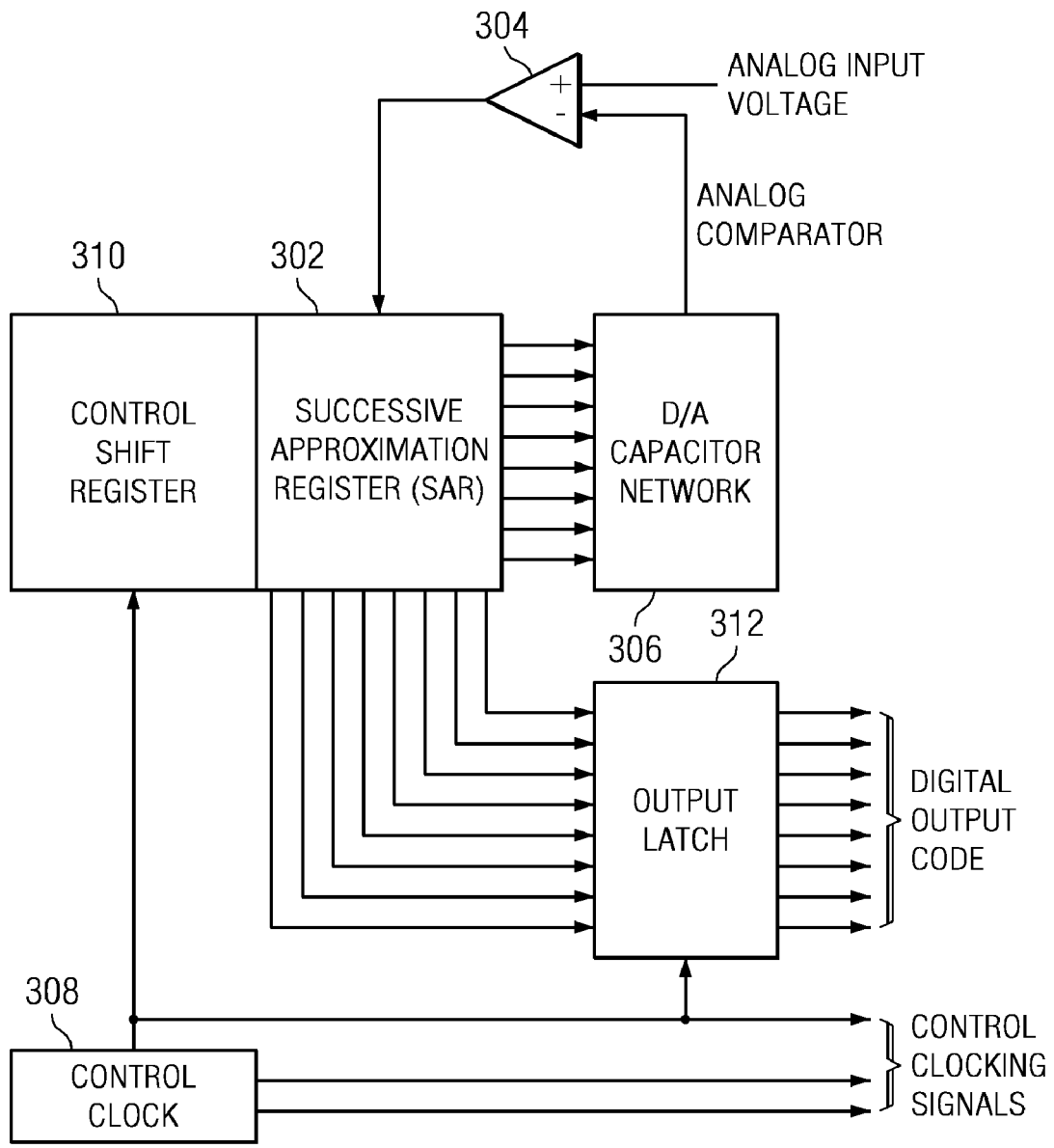
FIG. 3 is a functional block diagram of one embodiment of a SAR ADC using a capacitor network.

Referring now to FIG. 3, there is illustrated a functional block diagram of one embodiment of a SAR ADC utilizing a capacitor network 306. The SAR ADC can approximate the analog-to-digital signal to form an N-bit digital code. A successive approximation utilizes a successive approximation algorithm (SAR algorithm) to individually compare an analog input voltage to the mid-point of one of n ranges to determine the value of one bit. This process is repeated a total of n times, using n ranges, to determine the n bits of the code. The comparison is accomplished as follows. The SAR algorithm determines if the analog input is above or below the mid-point and sets the bit of the digital code accordingly. The SAR algorithm then assigns the bits beginning with the most significant bit. The bit is set to "1" if the analog input is greater than the mid-point voltage, or it is set at "0" if it is less than the mid-point voltage. The SAR algorithm then moves to the next bit and sets it as a "1" or a "0" based on the results of comparing the analog input with a mid-point of the next allowed range. Because the SAR algorithm must perform one approximation for each bit in the digital code, an n bit code requires n approximations.

The SAR ADC as illustrated in FIG. 3 consists of four functional blocks, a successive approximation register (SAR) 302, an analog comparator 304, a D/A converter 306 based on a switching capacitor network, and a clock 308. Control of the SAR algorithm to the n bit approximation is controlled by a control shift register 310. The output latch 312 latches in the bits of the digital output code as they are determined by the SAR 302 during the conversion cycle. The analog comparator 304 performs the comparisons of an analog input voltage with the mid-point of the selected one of n ranges presently being examined.

Figure 4:
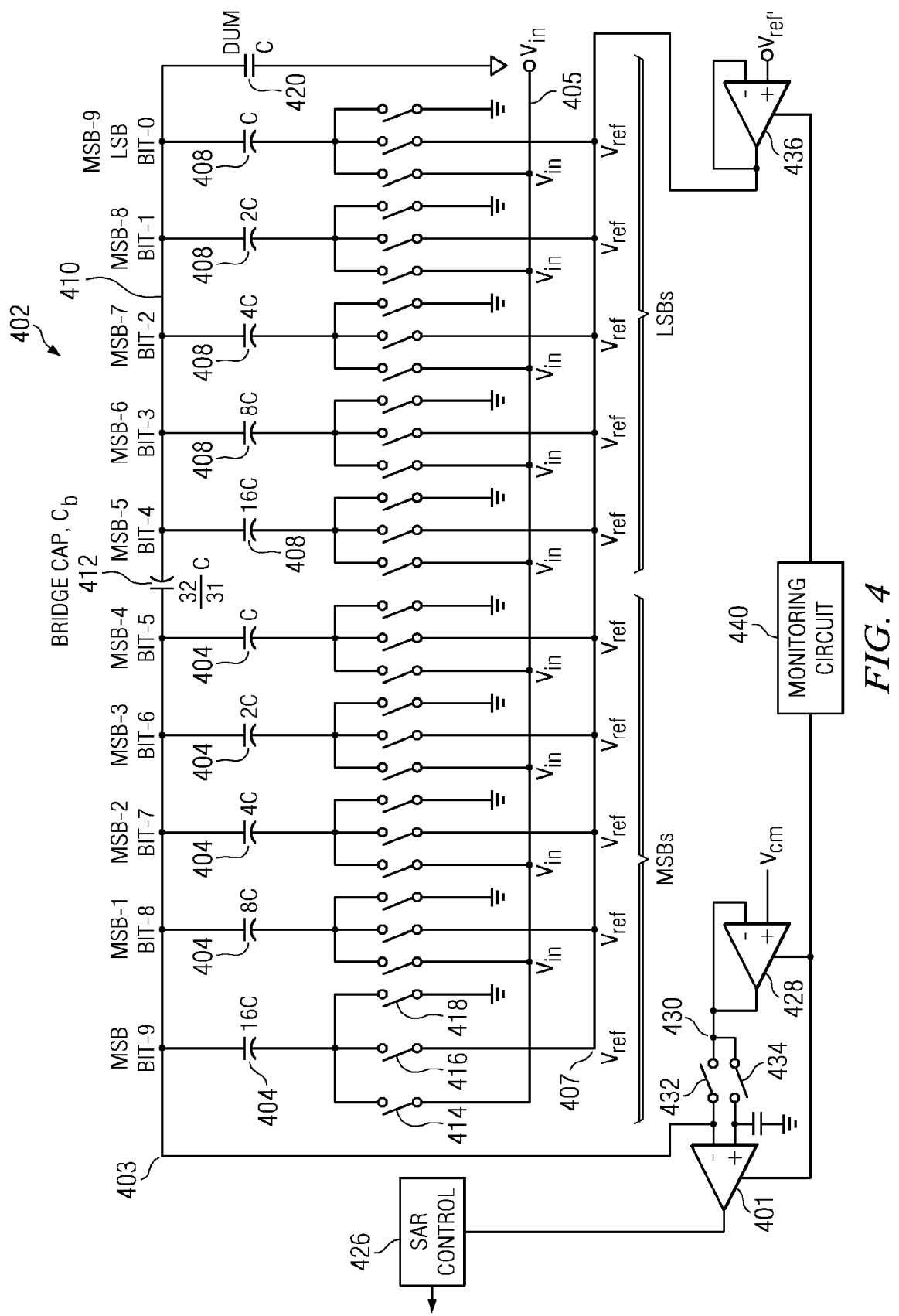
FIG. 4 is a schematic diagram of a 10-bit split array binary weighted analog-to-digital converter.

Referring now to FIG. 4, there is schematic diagram of a 10-bit split array binary weighted analog to digital converter utilizing a switched capacitor DAC configuration. The ADC is comprised of a comparator 401 having a positive and a negative input. The negative input is connected to a node 403, which node is connected a capacitor array 402. The capacitor array 402, in accordance with a conventional successive approximation algorithm, is a charge redistribution, binary weighed switch capacitor array that will have one plate of the capacitors associated therewith connected to an input voltage on an input node 405 or a reference voltage on a node 407 or ground, as will be described in more detail hereinbelow.

The 10-bit split capacitor array 402 includes a primary array and a secondary array. The primary array consists of a group of binary weighted switched capacitors 404 connected in parallel, wherein a first plate of each capacitor is interconnected at a common node 403, which is provided as an input to the negative input of the comparator 401. The secondary array consists of a second group of binary weighted capacitors 408 connected in parallel, wherein a first plate of each of these capacitors is connected to a second common node 410. The first node 406 and the second node 410 are interconnected via a bridge capacitor 412, this referred to as a bridged capacitor array. The capacitors 404 and 408 are binary weighted capacitors such that the capacitors progressively double in their capacitance from bit 0 to bit 4 and from bit 5 to bit 9. Thus, the capacitance of bit 0 is C, the capacitance of bit 1 is 2 C, the capacitive of bit 2 is 4 C and so forth until the capacitance of the bit 4 is equal to 16 C. There is a similar progression in the capacitance from bit 5 to bit 9. The opposite plates of each of the capacitors 404 or 408, which are not connected with common nodes 406 and 410, respectively, are selectively connected to either of an input voltage $V_{IN}$ at node 405 through a respective bit switch 414, a reference voltage $V_{REF}$ at node 407 through a respective bit switch 416 or ground through a respective bit switch 418. The capacitors connected to common node 406 comprise the most significant bits (MSBs) of the bridged capacitor DAC 402, and the capacitors connected to the node 410 comprise the least significant bits (LSBs). A dummy capacitor 420 connects between node 410 and ground.

The output of the comparator 401 is connected to a successive approximation register (SAR) control block 426, which is operable to execute the successive approximation algorithm. As is well-known in the art, the successive approximation register is operable to first sample the input voltage across all of the capacitors in the capacitor array 402, which, in the present embodiment as will be described hereinbelow, actually only provides sampling for the input voltage over all or only a portion of the capacitors. However, conventional SAR algorithms will sample with input voltage across all the capacitors. After this, select ones of the capacitors have the bottom-plate thereof connected to ground and select ones of the capacitors have the bottom-plate thereof connected to the reference voltage node 407 in a predetermined order. This causes redistribution of the charge, which charges the voltage on node 406. This is compared with a reference voltage and, if the voltage on node 406 is above the reference, then this capacitor has the bottom-plate thereof returned to ground. However, if the voltage on the node 406 does not rise above the reference voltage, then the voltage from the bottom-plate of this capacitor remains on the reference node voltage on node 407. This is a successive operation that sequentially steps through each of the capacitors, from the most significant or largest capacitor, to the least the significant or smallest capacitor. Again, this SAR operation is conventional.

In order to set a reference voltage on 407, a common mode voltage driver 428 is provided that is operable to drive a node 430, a lower impendence, with a common mode voltage $V_{CM}$ output thereof, the output connected to node 430. This is a non-inverting driver. Node 430 is connected via an auto-zero switch 432 to node 403 and via an auto-zero switch 434 to the positive input of the comparator 401. When the input voltage on node 405 is sampled onto the capacitor array 402, switches 432 and 434 are configured such that the common mode voltage $V_{CM}$ is connected to nodes 403 and to the positive input of comparator 401.

The reference voltage on node 407 is provided by reference voltage driver 436 and is operable to receive an input voltage $V_{REF}{}'$ on a positive input, voltage driver 436 having a negative input connected to the output thereof, the output connected to node 407 to provide a reference voltage $V_{REF}$.

A monitoring circuit 440 monitors the clock frequency within the SAR ADC 102 and provides control bits to SFR registers associated with each of the reference buffer 436, the common mode buffer 428 and the comparator 401. While the present disclosure has illustrated a single comparator 401, the comparator 401 may be implemented as a cascade of several comparator stages. The monitoring circuit 440 is utilized to monitor an operating frequency of the SAR ADC clock signal and alter the bias currents applied to each of the comparator 401, common mode buffer 428 and reference voltage buffer 436 based upon the clock frequency. Any number of monitoring circuits 440 may be utilized for providing this control of the bias voltages to these components.

The described embodiment discloses one SAR clock frequency. This is correct as long as the sampling phase and the conversion phase are both derived from one SAR clock. In reality, the sampling phase and the conversion phase can be determined by different clocks. The bias currents of the common-mode buffer 428 and the reference voltage buffer 436 must be inversely proportional to the sampling period of an associated clock, and the comparator 401 bias current needs to be inversely proportional to the conversion period (or directly proportional to the conversion clock frequency).

Depending upon the operating frequency of the SAR ADC 102, the bias currents applied to the each of the reference buffer 436, common mode buffer 428 and comparator 401, may be altered in order to save power. Changes in frequency of the clock may arise when a low power mode of operation is initiated or based on other system factors. Thus, in a lower frequency mode of operation wherein smaller bias currents may be utilized with each of the voltage reference buffer, common mode buffer and comparator, the bias currents may be reduced by a pre-selected amount in order to save power. When the system frequency rises to a higher level, the bias currents to the circuits may be increased back to the higher bias current levels necessary for operation at the higher frequencies. Thus, the bias currents of each of the reference voltage buffer, common mode buffer, and comparator may be dynamically altered based upon operating clock frequencies of the SAR ADC. This can provide significant power saving benefits to the operation of the circuitry including the SAR ADC. In alternative embodiments, when operating frequencies are to be at fixed, known levels, the bias current of the reference voltage buffer, common mode voltage buffer and comparator may be programmably selected by the user to provide the higher or lowest bias current values based upon the desired operating characteristics.

Figure 4A:
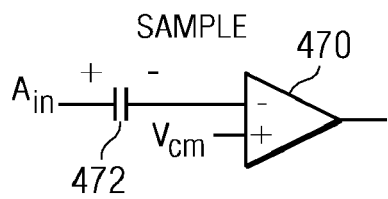
FIGS. 4*a*-4*c* illustrate the various operations of the digital converter of FIG. 4.
Figure 4B:
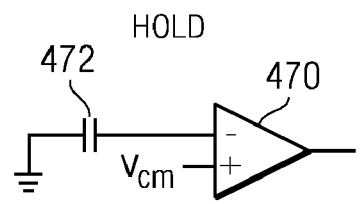
Figure 4C:
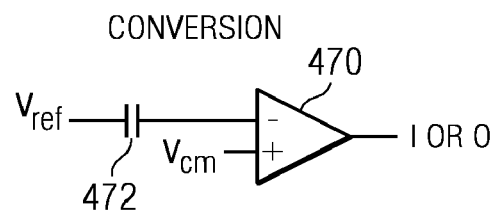

Referring now to FIGS. 4a through 4c, there is more fully illustrated the various states of the SAR converter when determining a particular bit using a comparator 470. Initially, as illustrated in FIG. 4a, the comparator 470 has capacitor 472 for a binary weighted capacitor array connected on the upper plate thereof to negative input of comparator 470 (capacitor 472 is the MSB capacitor for the array, the remaining capacitors not illustrated for exemplary purposes). The analog input voltage $A_{IN}$ is sampled on the lower or "switched" plate of capacitor 472 in the "sample" or "tracking" mode of operation. The negative input of comparator 470 is initially auto-zeroed to the voltage on the positive input of comparator 470 prior to or during the tracking mode of operation, such that both voltages are equal. The voltage on the positive input of comparator 470, in many cases, is set at a common mode voltage, $V_{CM}$, or ground.

In the "hold" mode of operation (FIG. 4b), the switched plate of capacitor 472 is connected to ground, thus pulling the negative input of comparator 470 to a voltage of $V_{CM}-A_{IN}$, as the positive input of comparator 470 remains connected to $V_{CM}$, and the logic state of the comparator 470 goes high (logic "1"). Referring now finally to FIG. 4c, when the digital value for the bit associated with capacitor 472 is being determined during the "conversion" mode of operation, the switched plate of capacitor 472 is switched to the reference voltage $V_{REF}$ thus disposing the negative input of comparator 470 at a voltage of $V_{CM}-A_{IN}+V_{REF}/2$. The output of the comparator 470 will become one or zero depending on whether the analog input voltage $A_{IN}$ is larger than one-half the reference voltage $V_{REF}$ (noting the remaining capacitors in the array (not shown) equal the value of the capacitor 472). If $A_{IN}$ is larger than one-half $V_{REF}$, the output state of the comparator 470 remains at a logic high (logic "1"), indicating that $V_{CM}-A_{IN}+V_{REF}/2$ is less than $V_{CM}$. If not, the output of the comparator 470 goes to a logic low level (logic "0"), indicating that $V_{CM}-A_{IN}+V_{REF}/2$ is greater than VCM. The associated MSB bit is set to the logic level indicated by the output of the comparator 470.

Figure 5:
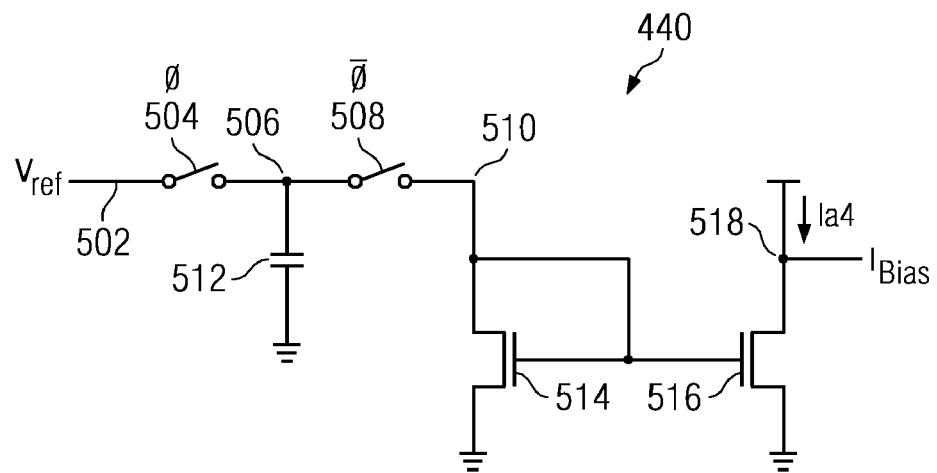
FIG. 5 is a schematic diagram of one embodiment of a monitoring circuit for monitoring the operating frequency of the SAR ADC.

Referring now to FIG. 5, there is illustrated one embodiment of a monitoring circuit 440. Within the monitoring circuit 440, a reference voltage $V_{REF}$ is applied at input node 502 through a first switch 504 connected between node 506 and 502. A second switch 508 is connected between node 506 and node 510. A capacitor 512 is connected between node 506 and ground. The switch 504 is closed during a first "on" phase of the clock cycle while switch 508 is closed during a second "off" phase of the clock cycle. A current mirror consisting of a transistor 514 and a transistor 516 having their gates connected to each other is used for providing the bias current $I_{OUT}$ responsive to the current provided at node 510. The transistor 514 is connected between node 510 and ground. The gate of transistor 514 and transistor 516 are connected to node 510. The transistor 516 is connected between node 518 and ground. The $I_{OUT}$ current is provided out from node 518 to enable generation of bias currents to the comparator 401, common mode buffer 428 and voltage reference buffer 436. The bias current for these components may comprise $I_{OUT}$ or be generated from $I_{OUT}$.

During phase one of operation of the circuit, when the clock signal is high, switch 504 is closed and switch 508 is open. This causing charging of the capacitor 512. During the second phase of operation, when the clock signal is low, switch 504 is open and switch 508 is closed and the voltage charge upon the capacitor 512 is dumped into the current mirror though node 510. The current mirror generates a current responsive to this as the current $I_{OUT}$, which is used for generating the bias current, to each of the referenced components. In this way, the average current $I_{OUT}$ provided at node 518 is proportional to the clock frequency applied to switches 504 and 508. When the clock frequency is lower, the bias current provided will be lower and when the clock frequency is higher, the applied bias current will be proportionally higher.

This manner of operation will provide significant power saving benefits to the SAR ADC such that when the SAR ADC is in a low power mode of operation, the clock frequency is correspondingly lower, the bias currents applied to various components of the SAR ADC will also be lowered to a predetermined level in order to minimize the bias current requirements and the associated power requirements to these components.

Figure 6:
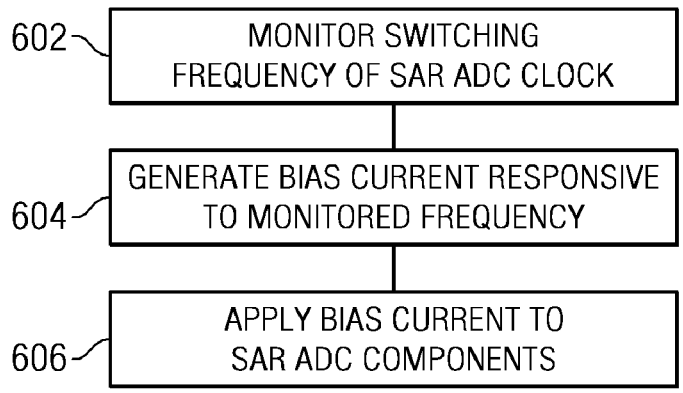
FIG. 6 is a flow diagram illustrating the manner in which the SAR ADC may operate using variable bias currents responsive to changes in frequency.

Referring now to FIG. 6 there is illustrated a flow diagram describing the manner in which the SAR ADC having variable bias currents may be operated. The monitoring circuitry 440 monitors the switching frequency of the SAR ADC clock at step 602. The monitoring circuit 440 then generates at step 604 a bias current responsive to this monitored frequency. Thus, as described, for lower clock frequency signals a smaller bias current is generated while for higher frequency signals a higher bias current is generated. This generated bias current is applied to various SAR ADC components at step 606, such as the comparator or comparator cascade, the reference voltage buffer and the common mode buffer.

Figure 7:
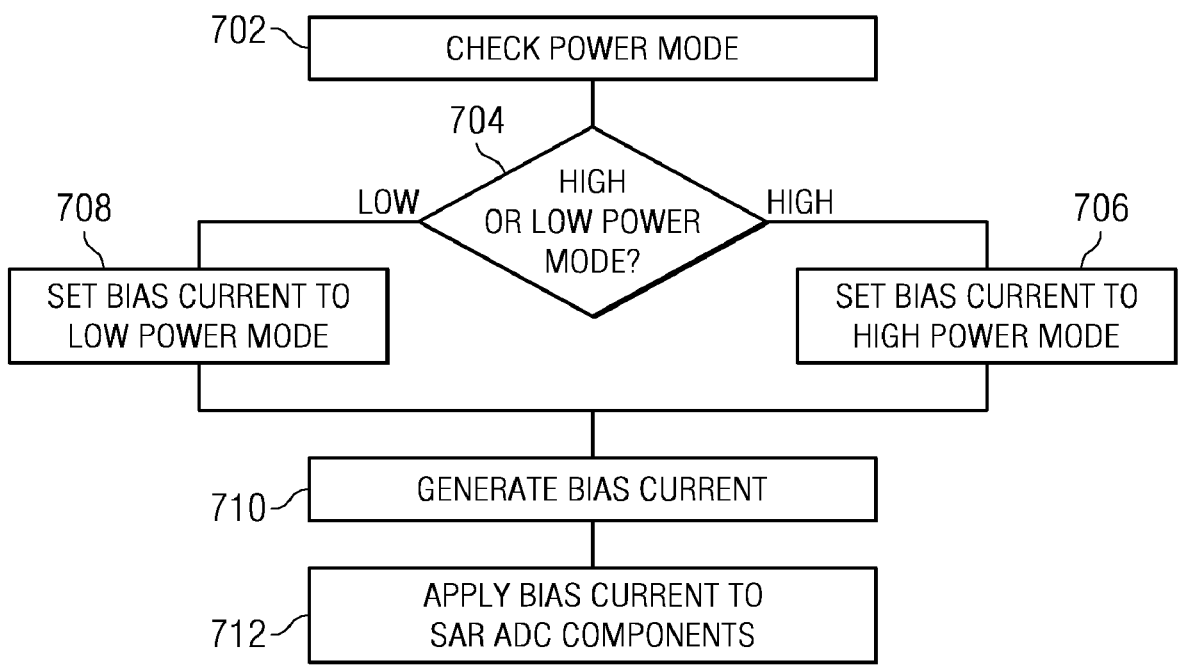
FIG. 7 is a flow diagram illustrating the manner of operation of a SAR ADC bias current responsive to high and low power modes of operation.

Referring now also to FIG. 7, there is illustrated an alternative embodiment wherein a bias current is selected and established based upon whether the SAR ADC 102 is operating in a high power or low power mode of operation. The power mode of operation of the SAR ADC is determined at step 702. Inquiry step 704 determines whether the SAR ADC is operating in a high or low power mode of operation. If the SAR ADC is operating in a high powered mode of operation the bias current is set to a high power mode level at step 706. If inquiry step 704 determines that the SAR ADC 102 is operating in a low power mode of operation, the bias current for the SAR ADC is set to a low power mode at step 708. Next, at step 710 the bias current is generated according to the established levels, and the generated bias currents is applied at step 712 to the various SAR ADC components such as the comparator, voltage reference buffer and common mode buffer as described herein above.

It will be appreciated by those skilled in the art having the benefit of this disclosure that this SAR analog-to-digital converter having variable currents for low power mode of operation provides power savings based on an operating frequency of the SAR ADC. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further

What is claimed is:

1. A successive approximation register (SAR) analog-to-digital converter (ADC), comprising
a capacitor array including a plurality of switched capacitors therein with varying weights each having a common plate connected to a common node and a switched plate;
at least one comparator for comparing the voltage on the common node of the capacitor array with a reference voltage, the at least one comparator having a first bias current applied thereto;
a SAR controller for sampling an input voltage on said capacitor array in a sampling phase, and redistributing the charge stored thereon in a conversion phase by selectively changing the voltage on select capacitors of the capacitor array in accordance with a SAR conversion algorithm;
wherein the first bias current operates at first levels responsive to a first mode of operation of the SAR ADC and operates at second levels responsive to a second mode of operation of the SAR ADC; and
wherein the common node is connected to a common mode voltage, and the switched plate is connectable to the input voltage during the sampling phase, and during the conversion phase, the switched plate of each of said array capacitors are connectable to the reference voltage to redistribute the charge thereon to the array and change the voltage on the common node.

2. The SAR ADC converter of claim 1, wherein the first mode of operation comprises a normal power mode of operation and the second mode of operation comprises low power mode of operation, further wherein the second levels of the first bias current are lower than the first levels of the first bias current.

3. The SAR ADC converter of claim 1, wherein the first mode of operation comprises a first operating frequency of the SAR ADC and the second mode of operation comprises a second operating frequency of the SAR ADC less than the first operating frequency of the SAR ADC, and further wherein the second levels of the first bias current are lower than the first levels of the first bias current.

4. The SAR ADC converter of claim 1, further comprising a monitoring circuit for monitoring an operating frequency of the SAR ADC and generating the first bias current at the first levels responsive to a first operating frequency range and generating the first bias current at the second levels responsive to a second operating frequency range.

5. The SAR ADC converter of claim 4, wherein the monitoring circuit further comprises:
a current mirror circuit for generating an output current related to the bias current responsive to an input current; and
first circuitry for charging a capacitor in a first phase of a clock cycle of the SAR ADC and discharging the capacitor into the current mirror circuit as the input current in a second phase of the clock cycle of the SAR ADC.

6. The SAR ADC converter of claim 5, wherein the first bias current for the comparator is responsive to the output current of the current mirror circuit.

7. The SAR ADC converter of claim 1 further including:
a common mode voltage buffer for applying a common mode reference voltage to the common node, the common mode voltage buffer having a second bias current applied thereto; and
a reference voltage buffer for applying a reference voltage to the switched plate of the plurality of switched capacitors of the capacitor array, the reference voltage buffer having a third bias current applied thereto.

8. A successive approximation register (SAR) analog-to-digital converter (ADC), comprising:
a capacitor array including a plurality of switched capacitors therein with varying weights each having a common plate connected to a common node and a switched plate;
a SAR controller for sampling an input voltage on said capacitor array in a sampling phase, and redistributing the charge stored thereon in a conversion phase by selectively changing the voltage on select capacitors of the capacitor array in accordance with a SAR conversion algorithm; and
circuitry for controlling the sampling of the input voltage by the capacitor array, the circuitry for controlling operating responsive to at least one applied bias current, wherein the at least one applied bias current operates at first levels responsive to a first mode of operation of the SAR ADC and the at least one applied bias current operates at second levels responsive to a second mode of operation of the SAR ADC.

9. The SAR ADC converter of claim 8, wherein the circuitry for controlling further comprises:
a common mode voltage buffer for applying a common mode reference voltage to the common node, the common mode voltage buffer having a first bias current applied thereto;
a reference voltage buffer for applying a reference voltage to the switched plate of the plurality of switched capacitors of the capacitor array, the reference voltage buffer having a second bias current applied thereto; and
at least one comparator for comparing the voltage on the common node of the capacitor array with a voltage on the switched plate of the plurality of capacitors of the capacitor array, the at least one comparator having a third bias voltage applied thereto.

10. The SAR ADC converter of claim 8, wherein the first mode of operation comprises a normal power mode of operation and the second mode of operation comprises a low power mode of operation, further wherein the second levels of the bias current are lower than the first levels of the bias current.

11. The SAR ADC converter of claim 8, wherein the first mode of operation comprises a first operating frequency of the SAR ADC and the second mode of operation comprises a second operating frequency of the SAR ADC less than the first operating frequency of the SAR ADC, and further wherein the second levels of the bias current are lower than the first levels of the bias current.

12. The SAR ADC converter of claim 8 further comprising a monitoring circuit for monitoring an operating frequency of the SAR ADC and generating the bias current at the first levels responsive to a first operating frequency range and generating the bias current at the second levels responsive to a second operating frequency range.

13. The SAR ADC converter of claim 12, wherein the monitoring circuit further comprises:
a current mirror circuit for generating an output current related to the bias current responsive to an input current; and
first circuitry for charging a capacitor in a first phase of a clock cycle of the SAR ADC and discharging the capacitor into the current mirror circuit as the input current in a second phase of the clock cycle of the SAR ADC.

14. A method for saving power within a successive approximation register (SAR) analog-to-digital converter (ADC), comprising the steps of:
monitoring an operating frequency of the SAR ADC;

generating an output current responsive to the monitored operating frequency of the SAR ADC, wherein the output current operates at a first level responsive to a first operating frequency of the SAR ADC and operates at a second level responsive to a second operating frequency of the SAR ADC; and providing a bias current to at least one component of the SAR ADC at a third level responsive to the output current at a first level and at a fourth level responsive to the output current at the second level.

15. The method of claim 14, wherein the first operating frequency is associated with a normal power mode of operation and the second operating frequency is associated with a low power mode of operation.

16. The method of claim 14, wherein a level of the bias current provided responsive to the second operating frequency is lower than the level of the bias current provided responsive to the first operating frequency.

17. The method of claim 14, wherein the step of generating further comprises the steps of:
charging a capacitor in a first phase of a clock cycle of the SAR ADC;
discharging the capacitor into a current mirror circuit in a second phase of the clock cycle of the SAR ADC; and
generating the output current responsive to an input current induced by the discharging of the capacitor into the current mirror circuit.

18. The method of claim 14, wherein the step of generating further comprises the step of generating a plurality of bias currents, each associated with a particular component of the SAR ADC responsive to the output current.

* * * * *